United States Patent
Omura et al.

(10) Patent No.: US 7,749,913 B2
(45) Date of Patent: Jul. 6, 2010

(54) SEMICONDUCTOR DEVICE MANUFACTURING METHOD

(75) Inventors: Mitsuhiro Omura, Kanagawa (JP); Keisuke Kikutani, Kanagawa (JP); Yutaka Okamoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 12/336,348

(22) Filed: Dec. 16, 2008

(65) Prior Publication Data
US 2009/0163030 A1 Jun. 25, 2009

(30) Foreign Application Priority Data
Dec. 18, 2007 (JP) ............... 2007-326422

(51) Int. Cl.
*H01L 21/302* (2006.01)
(52) U.S. Cl. ............. 438/706; 438/725; 438/738; 438/780; 257/E21.245
(58) Field of Classification Search ............. 438/706, 438/725, 738, 780; 257/E21.245
See application file for complete search history.

(56) References Cited
U.S. PATENT DOCUMENTS
7,037,850 B2  5/2006  Lee et al.
7,179,749 B2  2/2007  Lee et al.
2004/0198065 A1 * 10/2004 Lee et al. ............. 438/725
2007/0072334 A1  3/2007  Orlowski et al.

FOREIGN PATENT DOCUMENTS
JP       64-3663       1/1989
JP       2002-280388   9/2002

* cited by examiner

*Primary Examiner*—Jack Chen
(74) *Attorney, Agent, or Firm*—Finnegan, Henderson, Farabow, Garrett & Dunner, L.L.P.

(57) ABSTRACT

A first silicon containing film, an organic material film, a second silicon containing film are formed. The second silicon containing film is patterned to have a narrow width pattern and a wide width pattern. The organic material film is patterned to have a narrow width pattern and a wide width pattern. A side wall is formed on a side surface of the second silicon containing film and the organic material film by coating with a third silicon containing film. The narrow width pattern of the second silicon containing film is removed by using a mask that covers the second silicon containing film patterned to have a wide width pattern and the side wall. Finally, the organic material film is removed.

20 Claims, 10 Drawing Sheets

| FIRST SILICON CONTAINING FILM | Si | Si | Si | Si | SiO$_2$ | SiO$_2$ | SiO$_2$ | SiO$_2$ | SiN | SiN | SiN | SiN |
|---|---|---|---|---|---|---|---|---|---|---|---|---|
| SECOND SILICON CONTAINING FILM | SiO$_2$ | SiO$_2$ | SiN | SiN | Si | Si | SiN | SiN | Si | Si | SiO$_2$ | SiO$_2$ |
| THIRD SILICON CONTAINING FILM | SiO$_2$ | SiN | SiO$_2$ | SiN | Si | SiN | Si | SiN | Si | SiO$_2$ | Si | SiO$_2$ |

SEMICONDUCTOR DEVICE MANUFACTURING METHOD

CROSS-REFERENCE TO RELATED APPLICATIONS

This application is based upon and claims the benefit of priority from the prior Japanese Patent Application No. 2007-326422, filed on Dec. 18, 2007; the entire contents of which are incorporated herein by reference.

BACKGROUND OF THE INVENTION

1. Field of the Invention

The present invention relates to a semiconductor device manufacturing method.

2. Description of the Related Art

With high integration and high functionality of semiconductor devices, semiconductor patterns have been made finer and finer year after year. High integration has been particularly advancing in memory devices, so that still finer semiconductor patterns are required to be formed for gate electrodes or metal wires in the memory devices.

Semiconductor patterns are generally formed by exposure technique. The resolution of the exposure depends on the minimum dimension of the pattern and the pitch of the pattern. To realize the fine patterns, continuous technological innovation is being made in the exposure technique. However, there is a limit on how far the resolution of the exposure can be made fine. Such a limit arises from the wavelength of light and an electron beam used in the exposure. In principle, it is almost impossible to further reduce the resolution achievable in the exposure technique.

At the same time, recently, there has been an increasing demand to lower the resolution of the exposure than its current lower limit. Accordingly, as a conventional technique to respond to such a demand, in JP-A 2002-280388 (KOKAI), for example, there is proposed a method for forming a line-and-space pattern having a pitch finer than the lower limit of the resolution achievable in the exposure technique.

However, according to the conventional technique, while an ultra fine pattern exceeding the lower limit of the resolution achievable in the exposure is considered, the formation of a wider pattern at the same time is not considered.

BRIEF SUMMARY OF THE INVENTION

According to an aspect of the present invention, there is provided a semiconductor device manufacturing method including forming a first silicon containing film containing silicon above a semiconductor substrate; forming an organic material film above the first silicon containing film; forming a second silicon containing film that contains silicon and that differs from the first silicon containing film above the organic material film; forming a first mask having a narrow width pattern and a wide width pattern above the second silicon containing film; patterning the second silicon containing film into a narrow width pattern and a wide width pattern by using the first mask and employing anisotropic etching; under a condition of availability of etching selectivity to the patterned second silicon containing film and the first silicon containing film, removing the first mask and patterning the organic material film into the narrow width pattern and wide width pattern by employing anisotropic etching; forming above the semiconductor substrate a third silicon containing film that contains silicon and that differs from the first silicon containing film so that the patterned second silicon containing film and the organic material film are covered; etching back the third silicon containing film to form a side wall of the third silicon containing film on a side surface of the patterned second silicon containing film and the organic material film; forming a second mask made of an organic material so that the second silicon containing film patterned to have the wide width and the side wall thereof are selectively covered; removing the second silicon containing film patterned to have the narrow width by using the second mask; and under a condition of availability of etching selectivity to the second silicon containing film patterned to have the wide width, the first silicon containing film, and the third silicon containing film, removing the organic material film patterned to have the narrow width and the second mask.

DETAILED DESCRIPTION OF THE INVENTION

Exemplary embodiments of a semiconductor device manufacturing method according to the present invention, will be explained below in detail with reference to the accompanying drawings. This semiconductor device manufacturing method can form a wide width pattern and also a narrow width pattern having a pitch finer than the lower limit of the resolution achievable in exposure technique. The present invention is not limited to the following descriptions, and modifications can be appropriately made without departing from the scope of the present invention. For ease of understanding, in the drawings described below, contraction scales between each element can be different from actual scales.

FIGS. 1A to 1I are cross sections for explaining a semiconductor device manufacturing method according to a first embodiment of the present invention. In the first embodiment, by way of example, a case of forming a line-and-space pattern of a silicon nitride film that can be used for a hard mask at the time of processing a gate electrode is described.

Figure 1A:
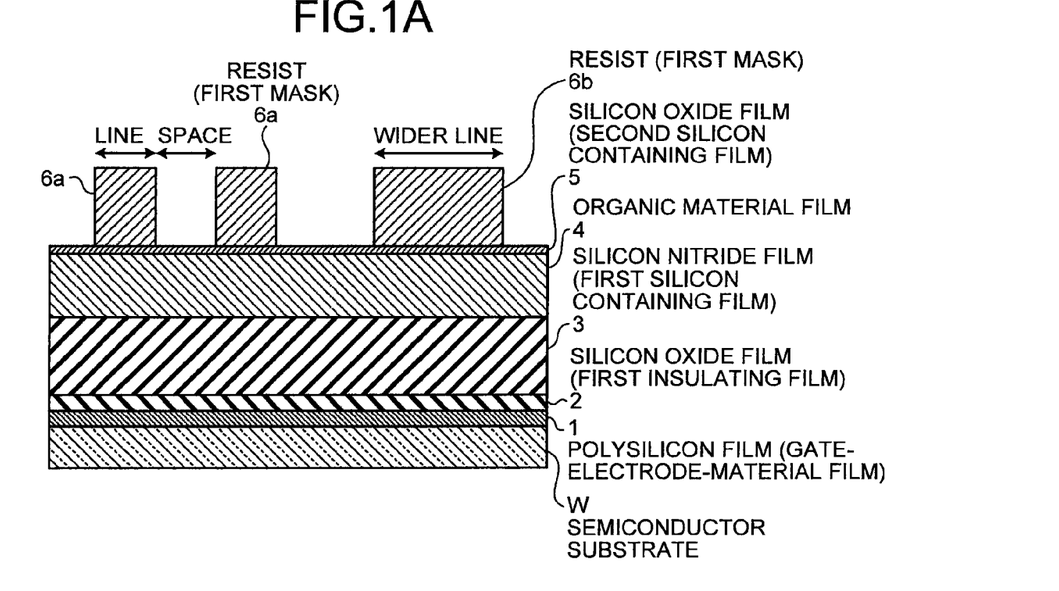
FIGS. 1A to 1I are cross sections for explaining a semiconductor device manufacturing method according to an embodiment of the present invention.

First, on a semiconductor substrate W such as silicon, a polysilicon film 1 as a gate-electrode-material film is formed by chemical vapor deposition (CVD) technique, and on top of the polysilicon film 1, a silicon oxide film ($SiO_2$) 2 as a first insulating film is formed by the CVD technique. Subsequently, on the silicon oxide film 2, a silicon nitride film (SiN) 3 as a first silicon containing film containing silicon is formed by using the CVD technique. The first silicon containing film is not limited to the silicon nitride film 3, and can be formed by a material containing silicon.

An organic material film 4 is then deposited on the silicon nitride film 3 by using the CVD technique. On top of the organic material film 4, a coating-type silicon oxide film (Spin On Glass (SOG)) 5 as a second silicon containing film containing silicon, and a photoresist as a first mask are successively laminated by using spin coat technique. This is followed by patterning a line-and-space pattern and a desired wider line to the photoresist by using exposure technique. This patterning results in the formation, as the first mask having the narrow width patterns and the wide width patterns, a resist 6a or narrow resist pattern and a resist 6b or wide resist pattern, on the silicon oxide film 5 or the second silicon containing film. At this time, a dimensional ratio between a line (resist 6a) in which a photoresist is left and a space in which the photoresist is removed is set to 1:1 (FIG. 1A).

The silicon oxide film 5 serves also a role as a reflection preventive film to prevent a reflected light from working on the photoresist. The silicon oxide film 5 can be a silicon compound film deposited by the CVD technique rather than the coating-type silicon oxide film. The second silicon containing film is not limited to the silicon oxide film 5, and can be formed by a material that contains silicon and that is different from that of the first silicon containing film.

Figure 1B:
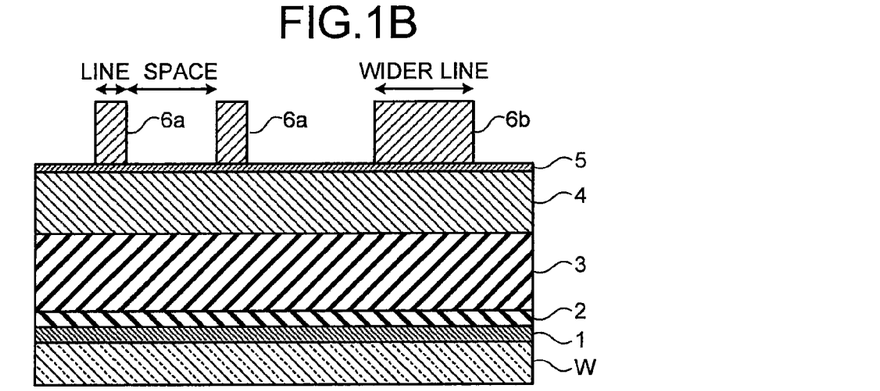

Subsequently, by a plasma process using oxygen ($O_2$) gas, as slimming processing of the resist 6a, the resist 6a of the line is recessed isotropically to process the ratio of the line-and-space to about 1:3. At this time, the resist 6b of a wider line also is recessed isotropically (FIG. 1B). This process is not limited to the plasma process using oxygen ($O_2$) gas, and can be any process as long as the resists 6a and 6b can be processed while maintaining high selectivity relative to the silicon oxide film 5. For example, gases other than oxygen gas such as nitrogen ($N_2$) gas, hydrogen ($H_2$) gas, and ammonia ($NH_3$) gas can be used. Further, as long as the ratio of the line-and-space can be formed at about 1:3 by exposure technique, this slimming processing can be omitted.

Figure 1C:
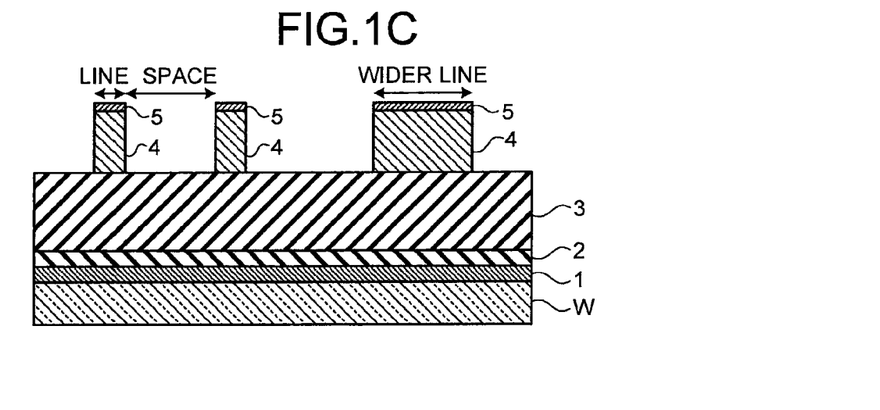

Subsequently, the resists 6a and 6b are used as masks to process the silicon oxide film 5 by dry etching using fluorocarbon gas as etching gas so that wide width and narrow width patterns can be made. Further, under a condition with etching selectivity to the patterned silicon oxide film 5 and the silicon nitride film 3, anisotropic etching is used to remove the resists 6a and 6b and also to pattern the organic material film 4 into the narrow width patterns and the wide width patterns. For example, the organic material film 4 is vertically processed by dry etching using oxygen gas as etching gas and also the resists 6a and 6b are removed to form a pattern having a line-and-space ratio of 1:3 and a pattern of a wider line in the silicon oxide film 5 and the organic material film 4 (FIG. 1C).

A case that the slimming processing is performed on the resists 6a and 6b as formed in FIG. 1A is explained above. In addition thereto, at the time of processing the silicon oxide film 5, when a trace amount of oxide is added to the fluorocarbon gas, for example, a slimming processing with good controllability can also be performed on the silicon oxide film 5 when the narrow width patterns and wide width patterns are transcribed. In this case, processes are advanced without performing the slimming processing on the resists 6a and 6b in FIG. 1A, and only at the time of processing the silicon oxide film 5 using the resists 6a and 6b in FIG. 1C as masks, the slimming processing can be performed on the silicon oxide film 5 until the line-and-space ratio in the narrow width pattern reaches 1:3.

Figure 2A:
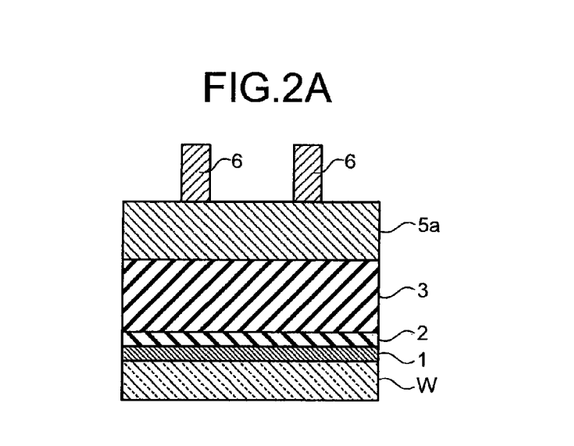
FIGS. 2A and 2B are cross sections for explaining a conventional semiconductor device manufacturing method.

FIGS. 2A and 2B are cross sections for explaining a conventional semiconductor device manufacturing method. In the conventional method, a silicon oxide film 5a is formed on the silicon nitride film 3 (FIG. 2A). For dry etching of the silicon oxide film 5a, etching gas containing halogen, such as fluorocarbon, needs to be used as etching gas. In this case, selectivity to an underlying layer should be high so as not to shave the underlying silicon nitride film 3 of the silicon oxide film 5a. However, to process the silicon oxide film 5a vertically, a C/F (carbon/fluorine) ratio of fluorocarbon gas needs to be decreased.

Figure 2B:
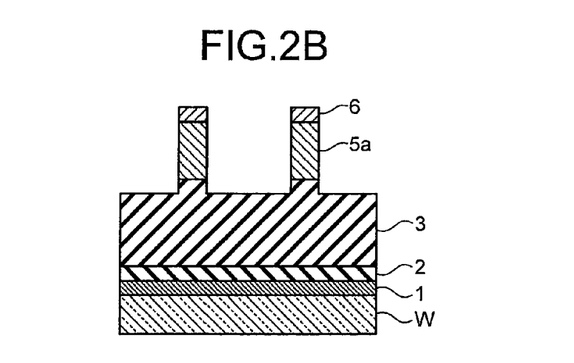

Thus, in the silicon nitride film 3 located in a region where no patterned resists 6 are present above, an unintended excessive processing (shaving) can be made (FIG. 2B). That is, a step (difference in film thickness) is occurred between in the silicon nitride film 3 in a region where the patterned resists 6 are present above and in the silicon nitride film 3 in a region shaved by dry etching. The step (difference in film thickness) is not removed even in a subsequent manufacturing process of a semiconductor device, and there is a problem that a property of a completed semiconductor device product is adversely affected.

However, in the semiconductor device manufacturing method according to the first embodiment, the organic material film 4 is formed on the silicon nitride film 3, and for processing the organic material film 4, the etching gas containing halogen, such as fluorine, is not used as etching gas. Thus, the underlying silicon nitride film 3 of the organic material film 4 is almost not shaved at all. That is, selectivity of the organic material film 4 to the silicon nitride film 3 is infinite, and the problem in the conventional technique is solved.

At the time of the dry etching, it is possible to use, as etching gas, gases such as oxygen ($O_2$) gas, nitrogen ($N_2$) gas, hydrogen ($H_2$) gas, and ammonia ($NH_3$) gas, which can process the organic material film 4 not containing halogen such as fluorine at a pressure as low as several 10 mTorr. To more easily realize the vertical processing, methane ($CH_4$) gas, carbon monoxide (CO) gas, carbon dioxide ($CO_2$) gas or the like can be added. The plasma process at the time of slimming-processing the resists 6a and 6b can also be performed by a similar etching chamber, and in this case, a condition under which a self bias is made small to isotropically facilitate the etching can be used. For example, with a dual-frequency-superimposed dry etching device (high frequency/low frequency) being taken into consideration, this condition can be easily realized by lowering a low-frequency power at which the self bias tends to generate.

Figure 1D:
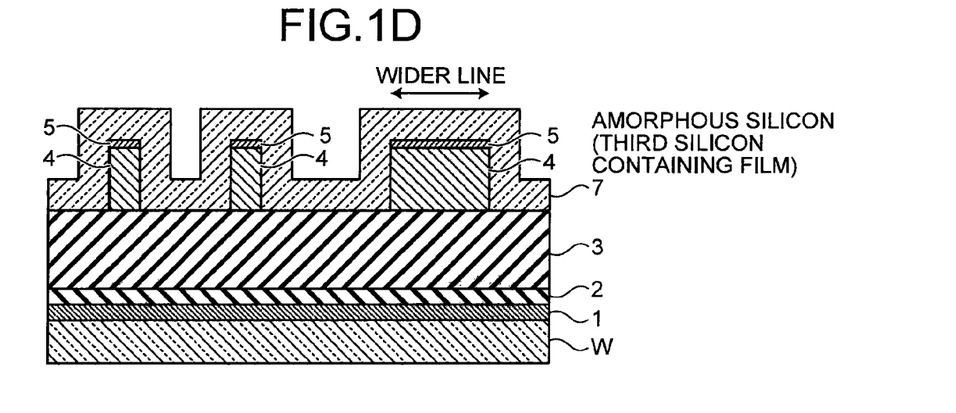
Figure 3:
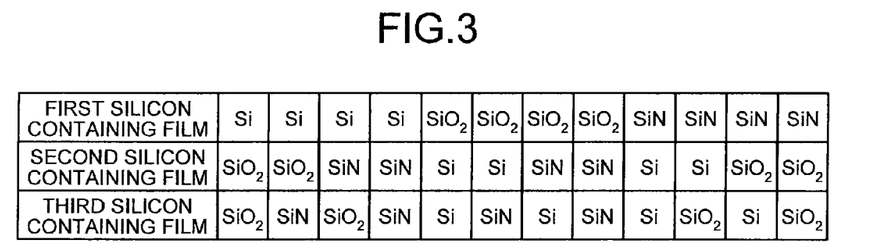
FIG. 3 depicts combination examples of materials of a first silicon containing film, a second silicon containing film, and a third silicon containing film employed in the semiconductor device manufacturing method according to an embodiment of the present invention.

Subsequently, in a manner to cover a laminated structure of the patterned organic material film 4 and silicon oxide film 5, a third silicon containing film, which is made of a material that contains silicon and that also differs from that of the first silicon containing film and which is made of a material that has selectivity to the first silicon containing film, is deposited. For example, in a manner to cover a laminated structure of the patterned organic material film 4 and the silicon oxide film 5, amorphous silicon 7, for example, which is a material that contains silicon and also has selectivity to the underlying silicon nitride film 3 is conformally deposited by using the CVD technique (FIG. 1D). Examples of a combination of materials of the first silicon containing film, the second silicon containing film, and the third silicon containing film can include those shown in FIG. 3.

Figure 1E:
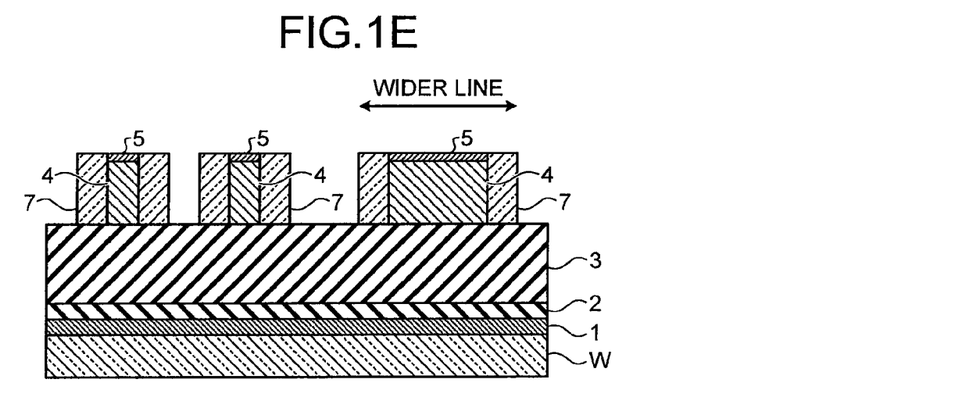
Figure 1F:
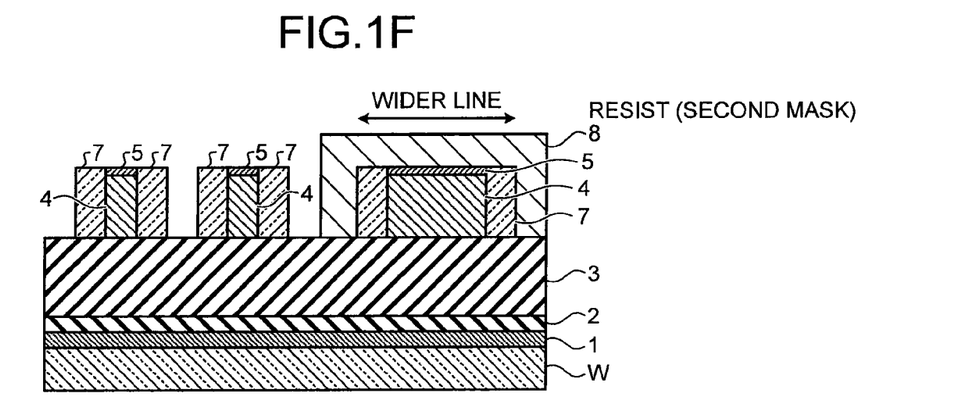

Subsequently, dry etching technique is used to etch back the amorphous silicon 7 until the surface of the silicon oxide film 5 is exposed, and thereby, on side surfaces of the laminated structure of the organic material film 4 and the silicon oxide film 5, side walls of the amorphous silicon 7 are formed (FIG. 1E). That is, on the side walls of the silicon oxide film 5 and the organic material film 4 patterned to have a narrow width and a wide width, the side walls of the amorphous silicon 7 are formed. Accordingly, a new wider line configured by the organic material film 4, the silicon oxide film 5, and the side walls of the amorphous silicon 7 is formed.

The dry etching is performed by, for example, gas containing chlorine ($Cl_2$) or hydrogen bromide (HBr). In the dry etching, because the fluorocarbon gas is not used as the etching gas, the amorphous silicon 7 can be processed while maintaining high selectivity relative to the underlying silicon nitride film 3. In this state, the organic material film 4 is completely covered by the silicon oxide film 5 and the side walls of the amorphous silicon 7.

Figure 1G:
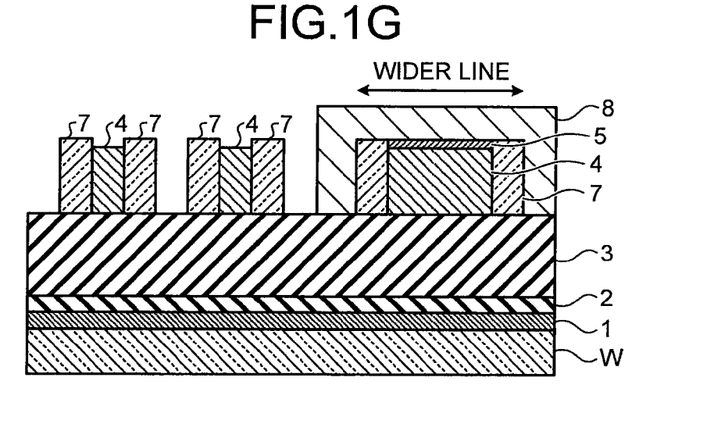

Subsequently, the organic material film 4 and the silicon oxide film 5 of a wider line, and the side walls of the amorphous silicon 7 are selectively covered as a second mask by resist 8 (FIG. 1F), and wet etching technique using fluorinated acid is employed to remove only the silicon oxide film 5 of a line-and-space (FIG. 1G).

Figure 1H:
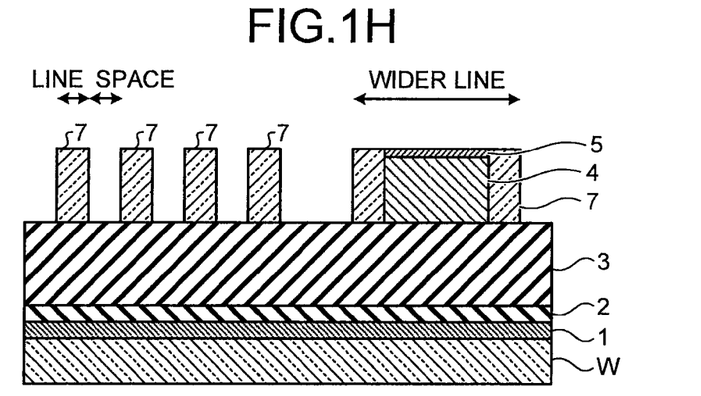

When ashing is performed on the silicon oxide film 5, the amorphous silicon 7, and the silicon nitride film 3 under the condition with etching selectivity, the organic material film 4 of a line-and-space and the resist 8 are removed to form a pattern in which a line-and-space pattern of the amorphous silicon 7, and a wider line obtained by combining the amorphous silicon 7, the silicon oxide film 5, and the organic material film 4 coexist (FIG. 1H). Examples of ashing gas can include oxygen ($O_2$) gas, nitrogen ($N_2$) gas, hydrogen ($H_2$) gas, and ammonia ($NH_3$) gas. At this time, each pitch of the line-and-space is half that at the time of forming the line-and-space pattern in the resist 6a by using the exposure technique (FIG. 1A), and thus miniaturization can be realized.

Figure 4A:
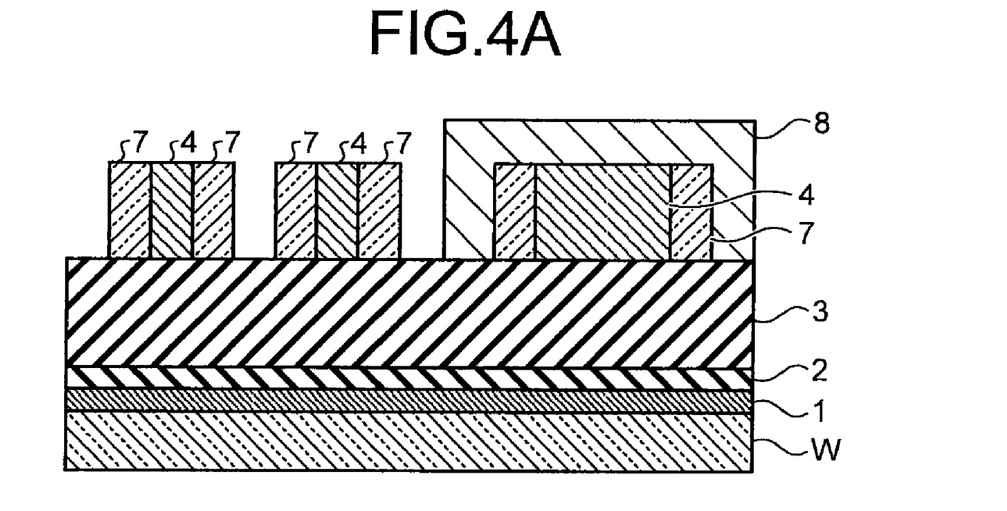
FIGS. 4A and 4B are cross sections for explaining a semiconductor device manufacturing method as a comparative example.
Figure 4B:
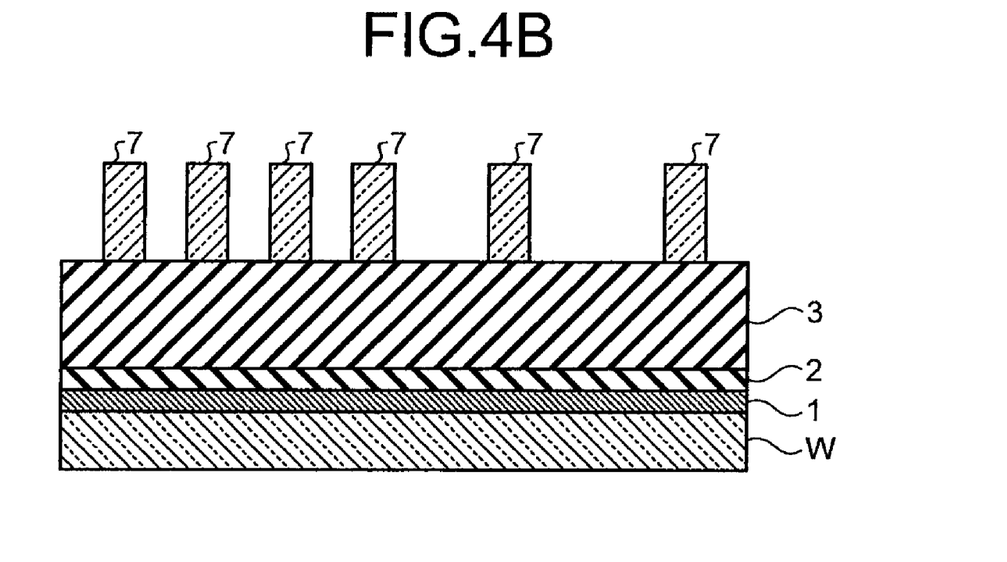

In this case, when the silicon oxide film 5 is not present on the organic material film 4 of a wider line, it necessitates that the resist 8 directly coats above an area of the organic material film 4 of a wider line at the time of coating the wider line by the resist 8 (FIG. 4A). As a result, the organic material film 4 of a wider line also is removed by the ashing subsequent thereto (FIG. 4B), and this arises a problem that the wider line cannot be formed. FIGS. 4A and 4B are cross sections of a semiconductor device manufacturing method as a comparative example. In spite of the problem, according to the semiconductor device manufacturing method according to the first embodiment, the silicon oxide film 5 is formed on the organic material film 4 of a wider line, and thus, in a process of removing the organic material film 4 of the line-and-space and the resist 8, a wider line can be surely formed while the organic material film 4 of a wider line is not removed.

It is advantageous to use a dry process, i.e., ashing, for the formation of the fine pattern, with respect to the removal of the silicon oxide film 5 and the organic material film 4 present between the side walls of the amorphous silicon 7. The reason for this is that in the conventional technique, between the side walls of the amorphous silicon 7, the silicon oxide film 5a only exists. The removal of the silicon oxide film 5a requires wet etching using fluorinated acid or the like. However, the side wall pattern of the amorphous silicon 7 can be collapsed by the surface tension of liquid penetrating through the patterns. However, when the organic material film 4 is present beneath the silicon oxide film 5 as in the first embodiment, the organic material film 4 can serve a support to suppress the collapse of the pattern. Due to the fact that the organic material film 4 can be removed later by a dry process not using liquid, there is no need to worry until the end that the collapse of the pattern occurs.

Figure 1I:
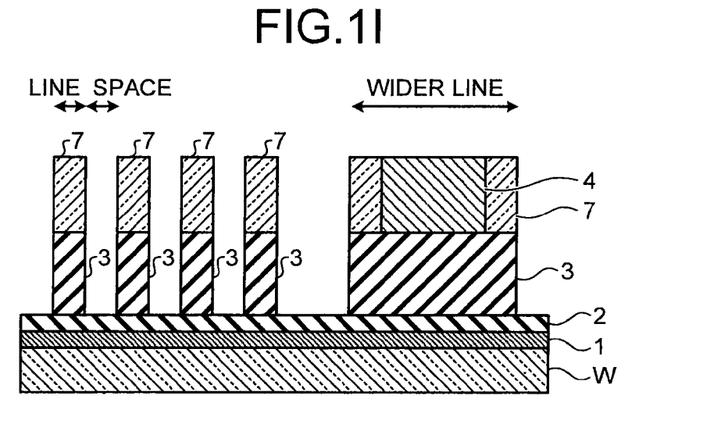

Subsequently, these patterns are used as masks, and etching processing is performed on the silicon nitride film 3 by dry etching under the condition with etching selectivity relative to the amorphous silicon 7. Accordingly, these patterns are transcribed to the silicon nitride film 3, and as a result, a pattern of the silicon nitride film 3 in which a fine line-and-space and a wider line coexist can be obtained (FIG. 1I). Further, the pattern in which a fine line-and-space and a wider line coexist is transcribed to the silicon oxide film 2 by anisotropic etching to form a pattern of the silicon oxide film 2. The pattern is used to process the gate-electrode material film by anisotropic etching, and thereby, a gate electrode having a fine pattern exceeding the lower limit of the resolution achievable in exposure technique and a wider pattern is formed.

As described above, according to the semiconductor device manufacturing method of the first embodiment, the pattern having a wider line and a line-and-space pattern having a line-and-space pattern pitch finer than the lower limit of the resolution achievable in the exposure technique can be simultaneously formed. Accordingly, a gate electrode having a wider pattern and a fine pattern exceeding the lower limit of the resolution achievable in the exposure technique can be simultaneously formed.

In the first embodiment, the organic material film 4 is formed above the silicon nitride film 3 or first silicon containing film, and the organic material film 4 is processed by dry etching without using etching gas containing halogen such as fluorine. Accordingly, it is possible to prevent the generation of a step (difference in film thickness) in the silicon nitride film 3 as a result of the occurrence of excessive processing (shaving) in the silicon nitride film 3. Accordingly, it is possible to prevent deterioration in property of a semiconductor device product resulting from the step (difference in film thickness) of the silicon nitride film 3, and thus a high-quality semiconductor device product can be made.

Figure 5A:
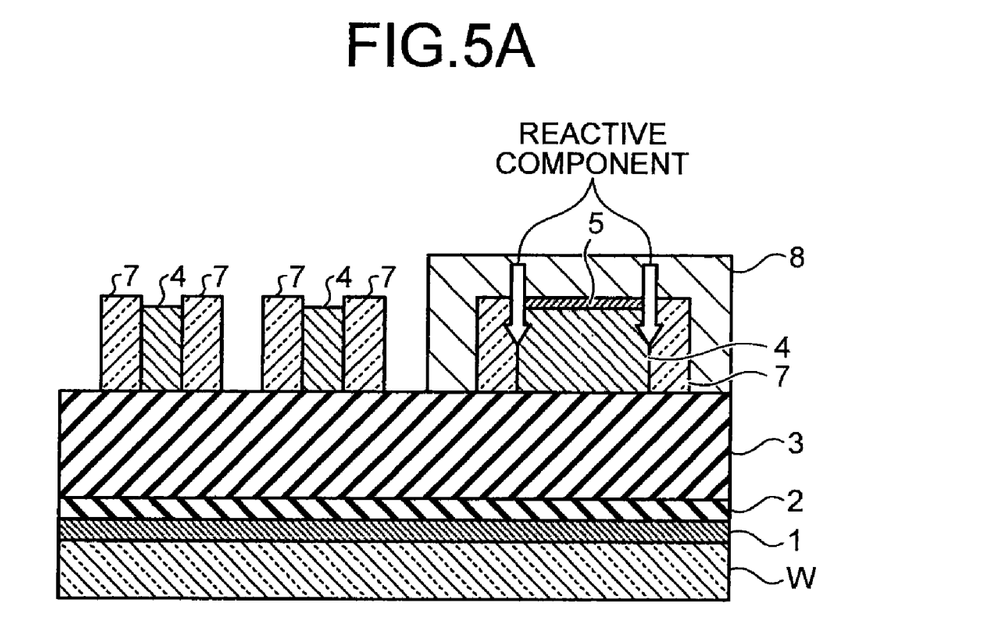
FIGS. 5A and 5B are cross sections for explaining erosion of a core material of a wider line pattern (an organic material film of the wider line pattern)
Figure 5B:
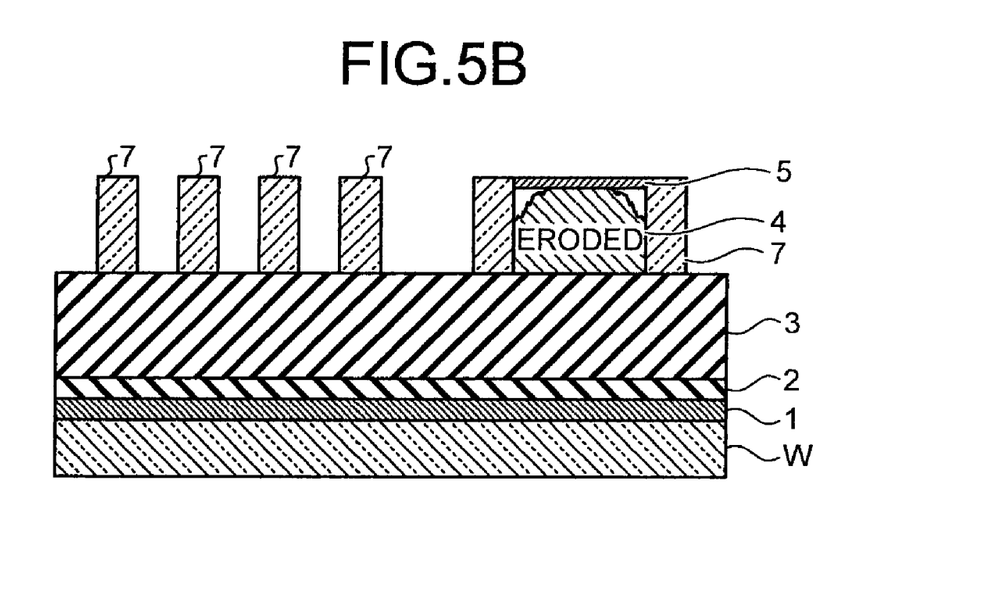

FIGS. 5A and 5B are cross sections for explaining erosion of a core material of the wider line pattern (the organic material film 4 of the wider line pattern). In the first embodiment, there is a possibility that reactive components or radical particles in the process (FIG. 1H) of removing a core material of the line-and-space pattern (the organic material film 4 of the line-and-space pattern) and the resist 8 coating the wider line pattern infiltrate from the gap between the side walls of the amorphous silicon 7 and the silicon oxide film 5 (FIG. 5A) so that the core material of the wider line pattern (the organic material film 4 of the wider line pattern) can be eroded (FIG. 5B). In a semiconductor device manufacturing method according to a second embodiment of the present invention, in which the infiltration of reactive components, radical particles or the like is suppressed.

Figure 6A:
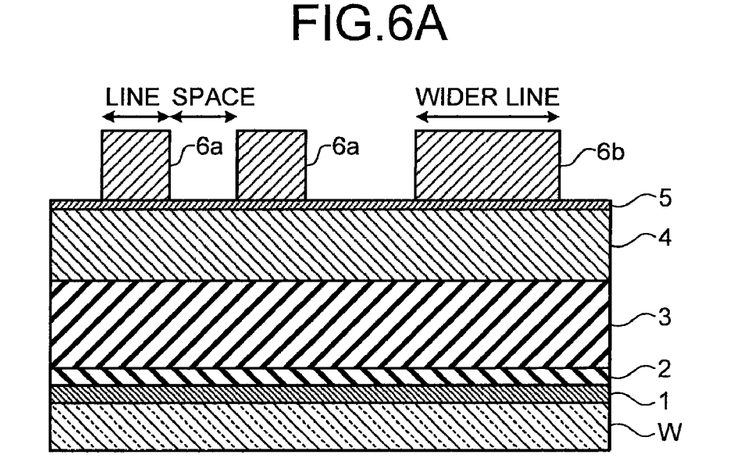
FIGS. 6A to 6H are cross sections for explaining a semiconductor device manufacturing method according to an embodiment of the present invention.

FIGS. 6A to 6H are cross sections for explaining a semiconductor device manufacturing method according to the second embodiment. First, as necessary, according to a process similar to that in the first embodiment, a plasma process using oxygen gas is employed as slimming processing of the resists 6a and 6b to isotropically recess the resists 6a and 6b of the line, and thus the ratio of the line-and-space is adjusted (FIG. 6A). At this time, widths of the resists 6a and 6b of the line are made larger than a final target dimension at the time of the slimming processing (FIG. 1B) in the first embodiment so that the ratio of the line-and-space of the resist 6a is made larger than 1:3.

Figure 6B:
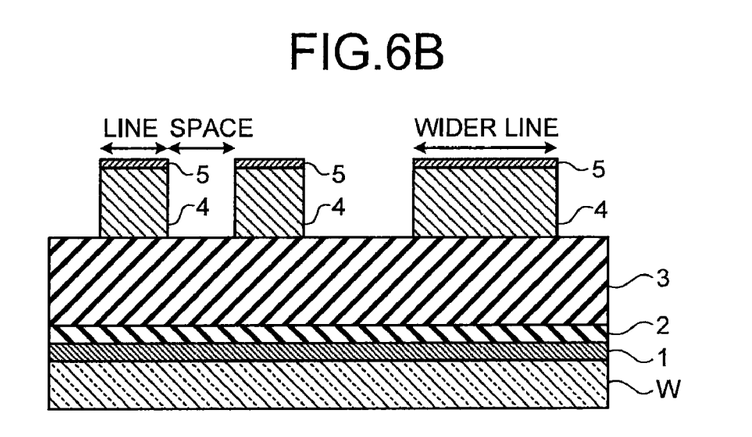

Subsequently, the resists 6a and 6b are used as masks to process the silicon oxide film 5 by dry etching using fluorocarbon gas as etching gas to be patterned into the narrow width patterns and the wide width patterns. As necessary, similarly to the first embodiment, the slimming processing to the silicon oxide film 5 at the time of the pattern transcription can be performed. However, in this case also, the ratio of the line-and-space in the narrow width pattern after the slimming processing is made larger than 1:3. Further, dry etching using oxygen gas is employed to vertically process the organic material film 4 and also to remove the resists 6a and 6b, and in this state, the line-and-space and the pattern of a wider line are formed in the silicon oxide film 5 and the organic material film 4 (FIG. 6B).

Figure 6C:
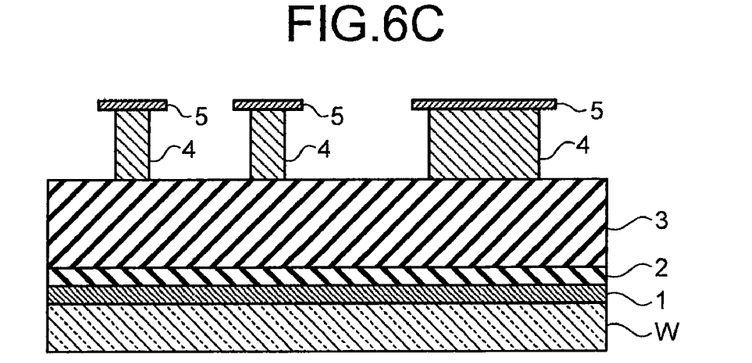

Thereafter, the slimming processing is performed only on the organic material film 4 to make the width of the organic material film 4 smaller than the width of the silicon oxide film 5, thereby forming a pattern of which the ratio of the line-and-space is 1:3 in the organic material film 4 (FIG. 6C). By this time, the line-and-space and the width of the organic material film 4 of a wider line are the final target dimension at the time of the slimming processing (FIG. 1B) in the first embodiment. When the plasma process by the oxygen gas, for example, is performed similarly to the slimming processing of the resists in the first embodiment, without using fluorocarbon gas, the organic material film 4 can be subjected selectively to the slimming processing to the silicon oxide film 5.

Figure 6D:
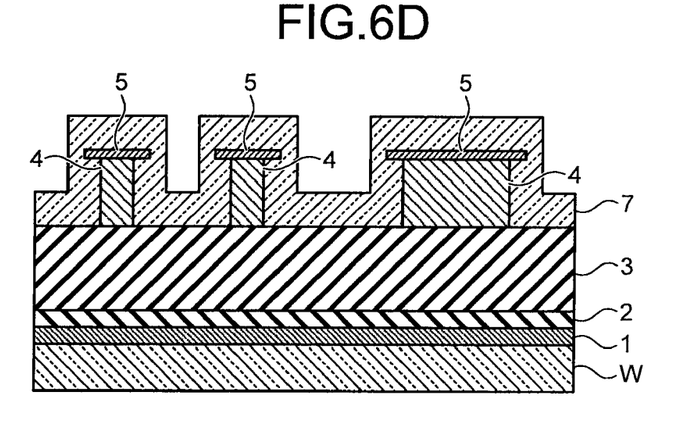

This is followed by conformal deposition of the amorphous silicon 7, for example, by using the CVD technique, as a material containing silicon and also having selectivity relative to the underlying silicon nitride film 3 to cover the laminated structure of the patterned organic material film 4 and silicon oxide film 5 (FIG. 6D).

Figure 6E:
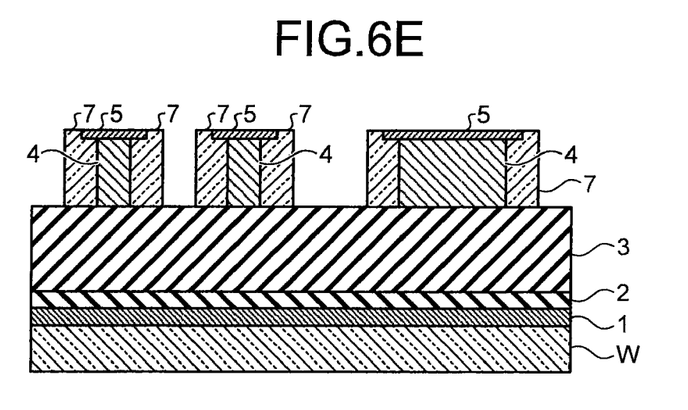
Figure 6F:
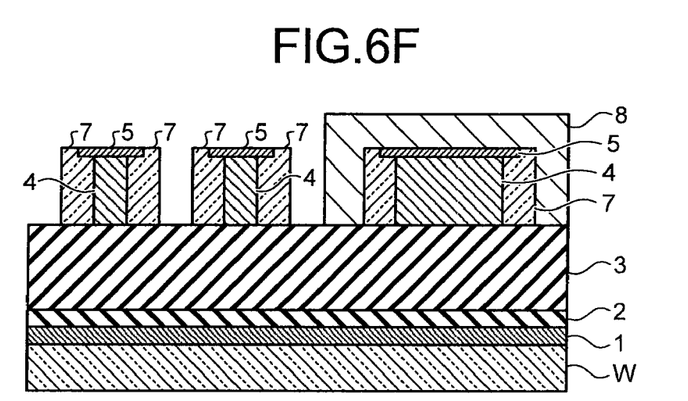

Subsequently, dry etching technique is used to etch back the amorphous silicon 7 until the surface of the silicon oxide film 5 is exposed, and thereby, on side surfaces of the laminated structure of the organic material film 4 and the silicon oxide film 5, side walls of the amorphous silicon 7 are formed (FIG. 6E). In the second embodiment, the side wall of the amorphous silicon 7, of which the contact surface with the silicon oxide film 5 is in an L-letter shape (labyrinth structure), is formed.

The dry etching is performed by using gas containing chlorine ($Cl_2$) or hydrogen bromide (HBr), for example. In the dry etching, because the fluorocarbon gas is not used as the etching gas, the amorphous silicon 7 can be processed while maintaining high selectivity relative to the underlying silicon nitride film 3.

Figure 6G:
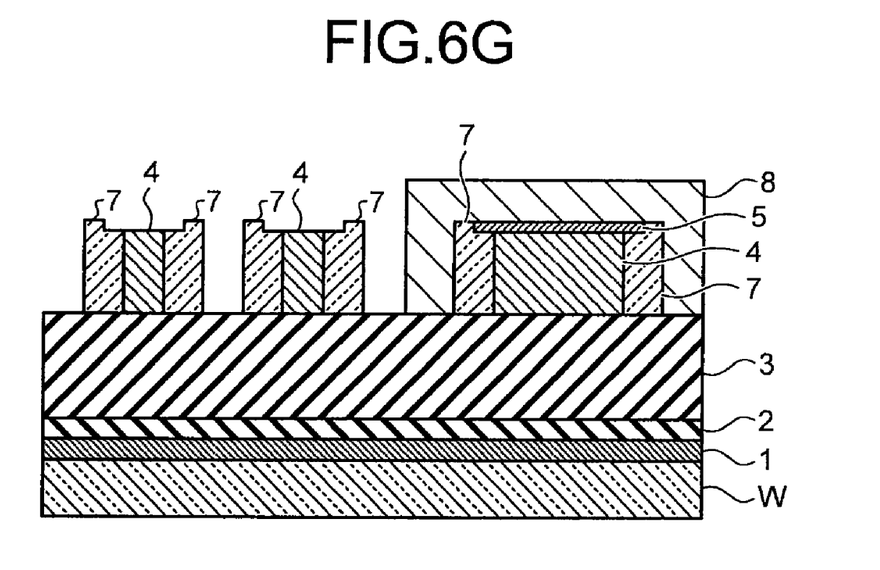

Thereafter, the organic material film 4 and the silicon oxide film 5 of a wider line, and the side wall of the amorphous silicon 7 are selectively covered by the resist 8 (FIG. 6F), and wet etching technique using fluorinated acid is employed to remove only the silicon oxide film 5 of the line-and-space (FIG. 6G).

Figure 6H:
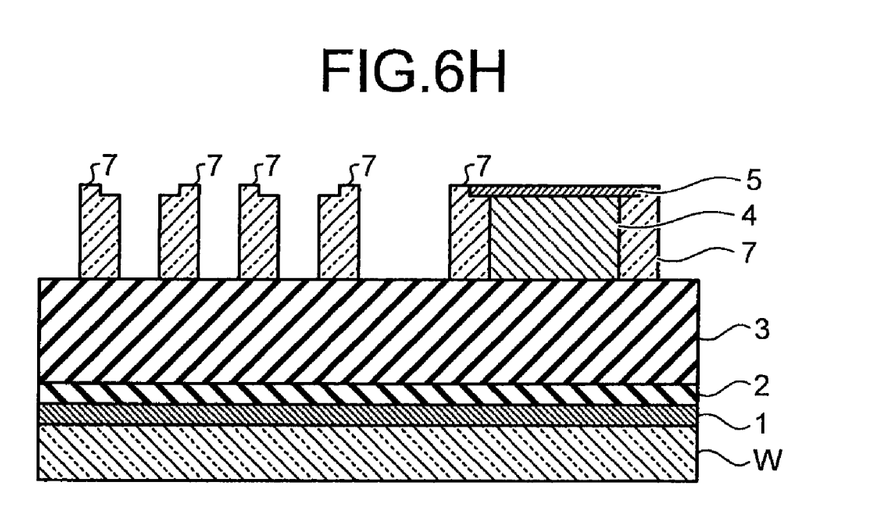

Subsequently, when ashing is performed on the silicon oxide film 5, the amorphous silicon 7, and the silicon nitride film 3 under the condition with etching selectivity, the organic material film 4 of the line-and-space and the resist 8 are removed so that a pattern in which a line-and-space pattern of the amorphous silicon 7 and a wider line configured by the amorphous silicon 7, the silicon oxide film 5, and the organic material film 4 coexist is formed (FIG. 6H).

Figure 7:
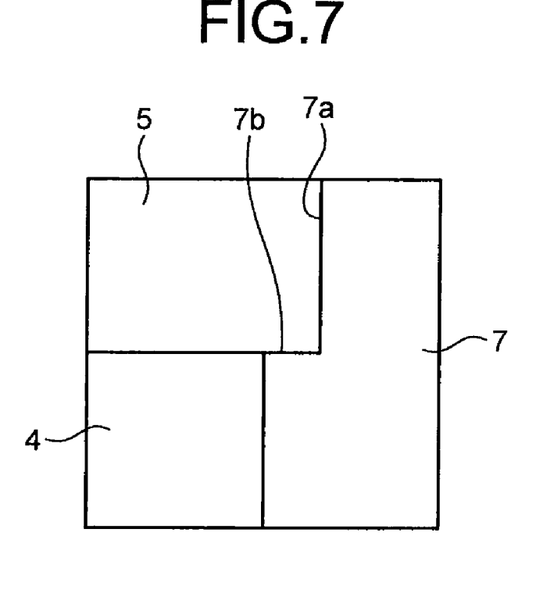
FIG. 7 is an enlarged cross section of a surrounding area of a contact surface with a silicon oxide film of side walls of amorphous silicon in an embodiment of the present invention.

A contact surface of the side walls of the amorphous silicon 7 with the silicon oxide film 5 is in an L-letter shape (labyrinth structure) (FIG. 7). That is, the side walls of the amorphous silicon 7 have a contact surface 7a with the silicon oxide film 5 in a vertical direction and a contact surface 7b in a horizontal direction. The contact surface 7a and the contact surface 7b are connected. FIG. 7 is an enlarged cross section of a surrounding area of the contact surface with the silicon oxide film 5 of the side walls of the amorphous silicon 7 in the second embodiment.

Accordingly, even when a reactive component, radical particles or the like in the process of removing the resist 8 infiltrate from a gap between the side walls of the amorphous silicon 7 and the contact surface 7a with the silicon oxide film 5, these substances are stopped by the contact surface 7b, and thus the substance are inhibited from reaching the core material of the wider line pattern (the organic material film 4 of the wider line pattern).

Figure 8:
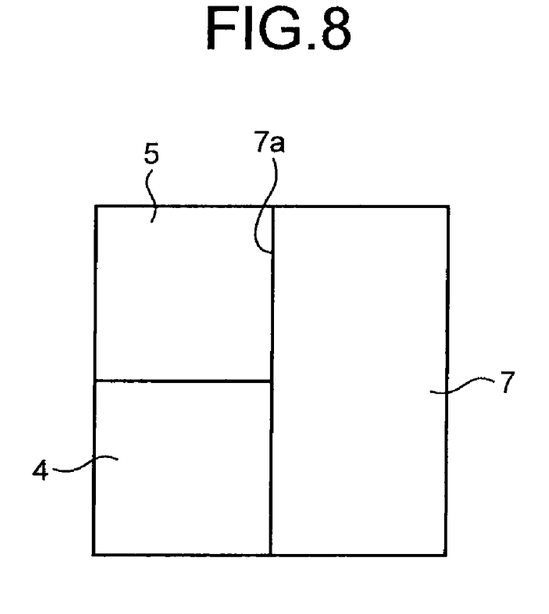
FIG. 8 is an enlarged cross section of a surrounding area of the contact surface, when the contact surface of the side wall of the amorphous silicon with the silicon oxide film is not in an L-letter shape.

Due to the presence of the contact surface 7a and the contact surface 7b, as compared to a case that the contact surface is not in an L-letter shape (labyrinth structure), and only the contact surface 7a exists (FIG. 8), an infiltrating path of a reactive component, radical particles or the like can be made longer. Even when a reactive component, radical particles or the like continue to infiltrate along the contact surface 7b, a time required for reaching the core material of the wider line pattern (the organic material film 4 of the wider line pattern) can be made longer. Thereby, a reactive component, radical particles or the like are inhibited from reaching the core material of the wider line pattern (the organic material film 4 of the wider line pattern) before the removal of the resist 8 is ended. FIG. 8 is an enlarged cross section of a surrounding area of the contact surface, when the contact surface of the side wall of the amorphous silicon 7 with the silicon oxide film 5 is not in an L-letter shape.

The following processes are the same as those in the first embodiment.

Thus, according to the semiconductor device manufacturing method of the second embodiment, a pattern having a wider line and a line-and-space pattern having a line-and-space pattern pitch finer than the lower limit of the resolution achievable in the exposure technique can be simultaneously formed. Thereby, a gate electrode having a wider pattern and a fine pattern finer than the lower limit of the resolution achievable in the exposure technique can be simultaneously formed.

According to the semiconductor device manufacturing method of the second embodiment, it is possible to inhibit a reactive component or radical particles infiltrating from the gap between the side walls of the amorphous silicon 7 and the silicon oxide film 5 from reaching the core material of the wider line pattern (the organic material film 4 of the wider line pattern) in the process of removing the resist 8. Accordingly, the erosion of the core material of the wider line pattern (the organic material film 4 of the wider line pattern) resulting from the infiltration of a reactive component or radical particles can be prevented, and therefore a high-quality semiconductor device product can be made.

In the above embodiments, formation of a hard mask of a gate electrode has been explained as an example of the present invention. However, the present invention is not limited thereto, and applied processes and materials can be changed accordingly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
    forming a first silicon containing film containing silicon above a semiconductor substrate;
    forming an organic material film above the first silicon containing film;
    forming a second silicon containing film that contains silicon and that differs from the first silicon containing film above the organic material film;
    forming a first mask having a narrow width pattern and a wide width pattern above the second silicon containing film;
    patterning the second silicon containing film into a narrow width pattern and a wide width pattern by using the first mask and employing anisotropic etching;
    under a condition of availability of etching selectivity to the patterned second silicon containing film and the first silicon containing film, removing the first mask and patterning the organic material film into the narrow width pattern and wide width pattern by employing anisotropic etching;
    forming above the semiconductor substrate a third silicon containing film that contains silicon and that differs from the first silicon containing film so that the patterned second silicon containing film and the organic material film are covered;
    etching back the third silicon containing film to form a side wall of the third silicon containing film on a side surface of the patterned second silicon containing film and the organic material film;
    forming a second mask made of an organic material so that the second silicon containing film patterned to have the wide width and the side wall thereof are selectively covered;
    removing the second silicon containing film patterned to have the narrow width by using the second mask; and
    under a condition of availability of etching selectivity to the second silicon containing film patterned to have the wide width, the first silicon containing film, and the third silicon containing film, removing the organic material film patterned to have the narrow width and the second mask.

2. The semiconductor device manufacturing method according to claim 1, wherein after the first mask is formed, the first mask is subjected to slimming processing, and slimming-processed first mask is used to pattern the second silicon containing film into the narrow width pattern and the wide width pattern.

3. The semiconductor device manufacturing method according to claim 2, wherein the first mask includes a resist pattern.

4. The semiconductor device manufacturing method according to claim 3, wherein the slimming processing includes performing a plasma process by using any one or more gas selected from oxygen gas, nitrogen gas, hydrogen gas, and ammonia gas.

5. The semiconductor device manufacturing method according to claim 1, wherein the second silicon containing film is subjected to slimming processing when patterned into the narrow width pattern and wide width pattern.

6. The semiconductor device manufacturing method according to claim 5, wherein the slimming processing includes performing dry etching using gas containing fluorocarbon gas and oxygen gas as etching gas.

7. The semiconductor device manufacturing method according to claim 1, wherein after the organic material film patterned into the narrow width pattern and wide width pattern is subjected to slimming processing selectively to the second silicon containing film, the third silicon containing film is formed above the semiconductor substrate.

8. The semiconductor device manufacturing method according to claim 7, wherein the side wall of the third silicon containing film have a first contact surface with the second silicon containing film in a vertical direction and a second contact surface with the second silicon containing film in a horizontal direction, and the first contact surface and the second contact surface contact each other.

9. The semiconductor device manufacturing method according to claim 1, further comprising:
    Patterning the first silicon containing film into a fine pattern and a wide pattern under a condition of availability of etching selectivity to the third silicon containing film after removing the organic material film patterned to have the narrow width pattern and the second mask.

10. The semiconductor device manufacturing method according to claim 9, further comprising:
    forming a processing target film above the semiconductor substrate before the first silicon containing film is formed above the semiconductor substrate the first silicon containing film being formed on the processing target film; and
    after patterning the first silicon containing film into the fine pattern and the wide pattern, transcribing the patterns of the first silicon containing film to the processing target film employing anisotropic etching to pattern the processing target film into the fine pattern and the wide pattern.

11. The semiconductor device manufacturing method according to claim 1, wherein the second silicon containing film includes a Spin on Glass (SOG) film.

12. The semiconductor device manufacturing method according to claim 1, wherein the first silicon containing film, the second silicon containing film, and the third silicon containing film include any one of a silicon nitride film, a silicon oxide film, and a silicon film.

13. The semiconductor device manufacturing method according to claim 12, wherein the first silicon containing film includes a silicon nitride film, the second silicon containing film includes a silicon oxide film, and the third silicon containing film includes an amorphous silicon film.

14. The semiconductor device manufacturing method according to claim 13, wherein the anisotropic etching in which the first mask is removed and also the organic material film is patterned into the narrow width pattern and wide width pattern includes performing dry etching using etching gas not containing halogen.

15. The semiconductor device manufacturing method according to claim 14, wherein the etching gas includes any one or more selected from oxygen gas, nitrogen gas, hydrogen gas, and ammonia gas.

16. The semiconductor device manufacturing method according to claim 15, wherein the etching gas further contains any one or more selected from methane gas, carbon monoxide gas, and carbon dioxide gas.

17. The semiconductor device manufacturing method according to claim 13, wherein the etching back of the third silicon containing film includes performing dry etching using etching gas not containing fluorocarbon gas.

18. The semiconductor device manufacturing method according to claim 17, wherein the etching gas includes any one of chlorine gas and hydrogen bromide gas.

19. The semiconductor device manufacturing method according to claim 13, wherein the organic material film patterned to have the narrow width and the second mask are removed by performing ashing using ashing gas not containing halogen.

20. The semiconductor device manufacturing method according to claim 19, wherein the ashing gas includes any one or more selected from oxygen gas, nitrogen gas, hydrogen gas, and ammonia gas.

* * * * *